May 19, 1953 O. E. COLGAN 2,639,372

SIGNAL SEEKING TUNER

Filed May 5, 1948 2 Sheets-Sheet 1

INVENTOR
OLIVER E. COLGAN
BY Philip G. Cooper
ATTORNEY

May 19, 1953 O. E. COLGAN 2,639,372

SIGNAL SEEKING TUNER

Filed May 5, 1948 2 Sheets-Sheet 2

INVENTOR
OLIVER E. COLGAN
BY Philip M. Cooper
ATTORNEY

Patented May 19, 1953 2,639,372

UNITED STATES PATENT OFFICE 2,639,372

SIGNAL SEEKING TUNER

Oliver E. Colgan, Collingswood, N. J., assignor to Radio Corporation of America, a corporation of Delaware Application May 5, 1948, Serial No. 25,210

5 Claims. (Cl. 250—20)

This invention pertains to a radio receiver and more particularly to a radio receiver of the signal seeking type, wherein the tuning element of the receiver is driven by a tuning motor during the tuning process, thereby causing the receiver tuner to scan the frequency spectrum until a station is automatically selected.

In signal seeking radio receivers which are of various types, one type employs a beat frequency oscillator (BFO) which beats against the intermediate frequency of the radio receiver during the automatic signal seeking operation to operate, or trigger, a relay connected in the output circuit of the receiver to stop the signal seeking operation automatically when the station is properly tuned in. Signal seeking receivers which utilize the beat frequency oscillator system, have heretofore required additional equipment other than that required for radio reception, such as, at least one separate tube for the beat frequency oscillator, filters, other circuits and the like, depending on the particular circuit used, all of which has increased the cost of manufacture.

The present invention contemplates the use of a radio receiver of the signal seeking type, employing a novel form of the BFO signal seeking system wherein a certain tube or tubes normally employed in the radio receiver are made to perform an additional function and operatively provide a BFO system for signal seeking purposes without the use of any additional tube or tubes, and at a minimum extra cost.

Ordinarily, in operation of signal seeking radio receivers, when it is desired to tune in a station, a tuning motor is started to initiate the tuning process to cause the receiver to scan a particular frequency spectrum. When a signal of sufficient strength is encountered, a portion of the received signal is applied to a control circuit which acts to remove the energy applied to the tuning motor, thereby causing the tuning operation to cease and permit the receiver to remain tuned to the particular received signal.

One of the problems heretofore encountered in adapting a conventional superheterodyne radio receiver of the manually tunable type, to a receiver of the automatic tunable type, was that it was necessary not only to provide a motor for automatically tuning the radio, but it was also necessary to provide at least one additional tube, and frequently more than one tube in a control circuit for the tuning motor.

The present invention contemplates overcoming the problem of adding an additional tube or tubes. It is, therefore, an object of the present invention to provide a conventional radio receiver of the superheterodyne type with the function of automatic signal seeking without the use of any additional tube or tubes that are not already being utilized in the radio receiver.

A further object of the invention is to provide a superheterodyne radio receiver of the signal seeking type by adapting a certain tube or tubes normally utilized in the radio receiver to perform a dual function which ordinarily would require the addition of one or more tubes for the control circuit of the tuning motor.

A further object of the invention is to provide a manually tunable superheterodyne radio receiver to operate as an automatic tunable superheterodyne radio receiver by providing a tuning motor but without the addition of any tube or tubes not already being utilized in said receiver.

A further object of the invention is to provide an automatic signal seeking superheterodyne radio receiver utilizing a relay in the plate circuit of the output tube without the addition of any tube not normally utilized in the radio receiver for signal reception purposes.

A further object of the invention is to provide an automatic signal seeking superheterodyne radio receiver utilizing a relay in the voice coil circuit of the output transducer without the addition of any tube not normally utilized in the radio receiver for signal reception purposes.

A further object of the invention is to adapt a conventional type of superheterodyne radio receiver to an automatically tunable superheterodyne radio receiver without the addition of any tube or tubes, which adaptation will be manufacturable at a minimum cost.

A still further object of the invention is to convert a manually tunable radio receiver to an automatically tunable radio receiver without the addition of any tube in the tuning motor control circuit.

Throughout the specification, like reference characters represent like parts.

Figure 1:
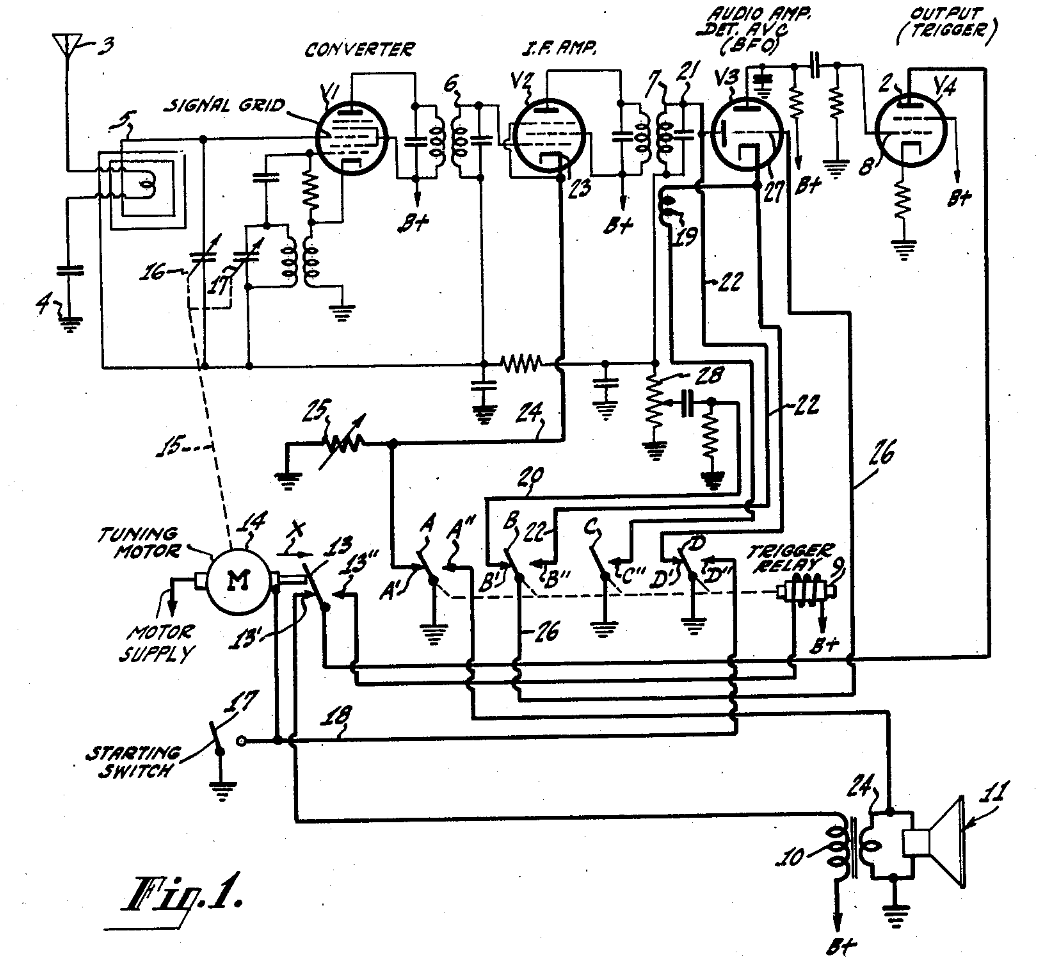
Figure 1 is a schematic diagram of a superheterodyne radio receiver of the signal seeking type, in normal signal-receiving positions, that is, not seeking.

Referring to the drawings, Fig. 1 shows a representative superheterodyne radio receiver circuit employing an antenna 3 and a ground connection 4, shown by conventional symbols, inductively coupled by means of a loop circuit 5, to the input of the first tube V1 of the radio receiver. The first tube V1 is the converter, having its output coupled through the I. F. transformer 6 to the input of an intermediate frequency (I. F.) amplifier tube V2. The output of the I. F. amplifier V2 is coupled through the I. F. transformer 7 to the input of the audio amplifier tube V3 which is shown as a combined audio amplifier, detector, and AVC source. The output of tube V3 is coupled to the input grid 8 of the output or trigger tube V4. The plate 2 of the output tube V4 is connected to the primary winding 10 of a transformer supplying the loudspeaker, or transducer 11, and through this winding to a source of positive voltage, indicated by the conventional symbol B+, the negative terminal of which is grounded.

A trigger relay 9 has movable contacts A, B, C, and D that cooperate with fixed contacts A′, A″, B′, B″, C″, D′ and D″. The tuning motor 14 has a movable contact 13 actuated by the motor energization and cooperating with fixed contacts 13′, 13″.

In normal operation for signal reception, the converter tube V1 includes an oscillator section that oscillates to shift the incoming signal to the intermediate frequency. The I. F. is amplified in tube V2, and in tube V3 the I. F. is detected and the detected audio frequency is further amplified, and fed into the output tube V4, and thence supplied to the loudspeaker. The movable contacts A, B, C, D and 13 normally occupy the positions shown, contact A shorting out a bias resistor 25 in the cathode return of tube V2, contact B establishing the connection between the output circuit of the detector and the input grid 27 of tube V3, contact C open-circuiting a return connection from the cathode of tube V3 through inductor 19, contact D grounding this cathode, and contact 13 completing the circuit of the transformer primary 10.

To provide automatic signal seeking for the superheterodyne radio receiver shown in Fig. 1, the tuning motor 14 is connected by a shaft 15 to the tuner portion of the radio receiver indicated by variable condensers 16 and 17. While variable condensers are shown specifically, it is to be understood that the shaft 15 may be connected to a permeability tuner, or any form of tuner which is adaptable for use in conjunction with the tuning motor. The trigger relay 9 is shown by conventional symbol to simultaneously operate the movable contacts A, B, C, and D.

The tuning motor 14 is of the type which centers itself in its bearing from a normally deviated position when at rest, by moving axially in the direction indicated by the arrow X when the tuning motor is energized by momentary closure of the starting switch 17. The starting switch is serially connected with the tuning motor 14 and a source of energy indicated by the legend "Motor supply." The motor shaft is insulated from the movable contact 13.

Energization of the tuning motor 14 initiates signal seeking, and due to movement of the motor shaft in the direction of the arrow X, causes the contact set 13—13′ to open, thereby interrupting the circuit connection between transformer primary 10 and plate 2 of the output tube V4. The same movement also closes contact set 13—13″ and completes the circuit from plate 2 of the output tube V4 through the windings of trigger relay 9 to B+.

Energization of the trigger relay 9 by the plate current normally passing through tube V4 will cause the movable contacts A, B, C, and D to be moved to the right so that there is an opening of contact sets A—A′, B—B′, and D—D′, and a closure of contact sets A—A″, B—B″, C—C″, and D—D″.

The opening of contact set D—D′ disconnects the cathode of the audio amplifier tube V3 from the direct ground return. The closure of contact set D—D″ completes the tuning motor energizing circuit through conductor 18 and the grounded contact D. It will be seen that the momentary closure of starting switch 17 causes the tuning motor, through closure of contact sets 13—13″ to momentarily energize the trigger relay 9, which in turn is provided, by means of contact set D—D″, with a holding circuit for maintaining energization of the tuning motor during the signal seeking operation.

The closure of contact set C—C″ connects the tickler feedback coil 19 to ground thereby placing it in the cathode return circuit of the audio amplifier tube V3. The opening of contact set B—B′ and the closure of contact set B—B″, switches the grid of the audio amplifier tube V3 from the audio frequency channel, which includes the volume control 28 to which it is connected by means of conductor 20, to the high side 21 of the secondary of the I. F. transformer to which it is connected by conductor 22. The opening of contact set A—A′ removes the direct ground connection from the cathode conductor 24 returning from cathode 23 of the I. F. amplifier tube V2, thereby inserting resistor 25 in the cathode return circuit of V2. The resistor 25 is shown as adjustable and functions as a sensitivity control. It is in the circuit only when the receiver is in signal seeking condition and controls the gain of the I. F. amplification stage. This determines the number of stations to which the signal seeking will respond, by limiting the incoming signal strength that will provide the desired signal level in the receiver. The closure of contact set A—A″ grounds the high side of the transformer winding 24, thereby muting the loudspeaker during the signal seeking operation.

The changeover of the movable contacts A, B, C, and D from the "playing position," as shown in Fig. 1, to the signal seeking position, when the relay 9 is energized, causes tube V3 to oscillate at the intermediate frequency because the tickler coil 19 feeds back the I. F. voltage to the secondary of the I. F. transformer 7, which secondary is now connected to the grid of the tube V3 via contact set B—B″ and conductors 22 and 26.

When the receiver is in signal seeking condition and the incoming signals are being scanned by the motor-operated tuning, the intermediate frequency signals supplied by the converter tube V1 are changing in frequency. As the tuning approaches that of an incoming signal, the converter output is at one side of the intermediate frequency and gradually shifts through the exact intermediate frequency when exactly tuned, to the other side of the intermediate frequency as the tuning leaves this signal. The next signal in the scanning spectrum goes through the same cycle and this repeats itself with each signal. These varying-frequency converter outputs beat or heterodyne with the oscillations of oscillator V3 which are fixed at the exact intermediate frequency, thereby producing a low frequency beat note corresponding to the difference between these frequencies. The beat note is usually of audio frequencies and is amplified by the output tube V4. Signals being exactly tuned in, if of sufficiently high intensity, will produce a beat note with a negative swing large enough in amplitude, and of sufficiently long duration, to bias off the grid 8 of tube V4 and interrupt or greatly lower its plate current. This deenergizes the windings of relay 9 for a period of time sufficient to permit the contacts A, B, C, and D to be restored to the normal playing position shown in Fig. 1. The momentary opening of contact set D—D'' will deenergize the tuning motor 14 causing same to cease operating, thereby stopping the tuning operation of the radio receiver. The opening of the contact set A—A'' removes the ground from the high side of the voice coil 24, thereby unmuting the speaker to permit aural reception of signals, and the closure of contact set A—A' again connects the cathode 23 of the tube V2 to ground via conductor 24, and the sensitivity control 25 is shunted out of the circuit.

Deenergization of the tuning motor 14 permits the movable shaft thereof to return to its deviated position effecting closure of contact set 13—13' which again connects the primary 10 of the loudspeaker to the plate 2 of the output tube V4. The opening of contact set C—C'' ungrounds the feedback tickler coil 19, and the shifting of contact B back to B' causes the grid 27 of the audio amplifier tube V3, to be disconnected from the high side 21 of the secondary of the I. F. transformer 7, and again connected to the volume control 28 via conductor 20.

The signal seeking radio receiver is thus restored to the signal-receiving condition shown in Fig. 1.

In the construction of Fig. 1 the multi-purpose tube V3, which is referred to generally as the first audio amplifier, is used to provide the function of the BFO in conjunction with the signal seeking operation of the circuit. The modification of the invention shown in Fig. 2, utilizes the I. F. amplifier tube V2 as the BFO.

Figure 2:
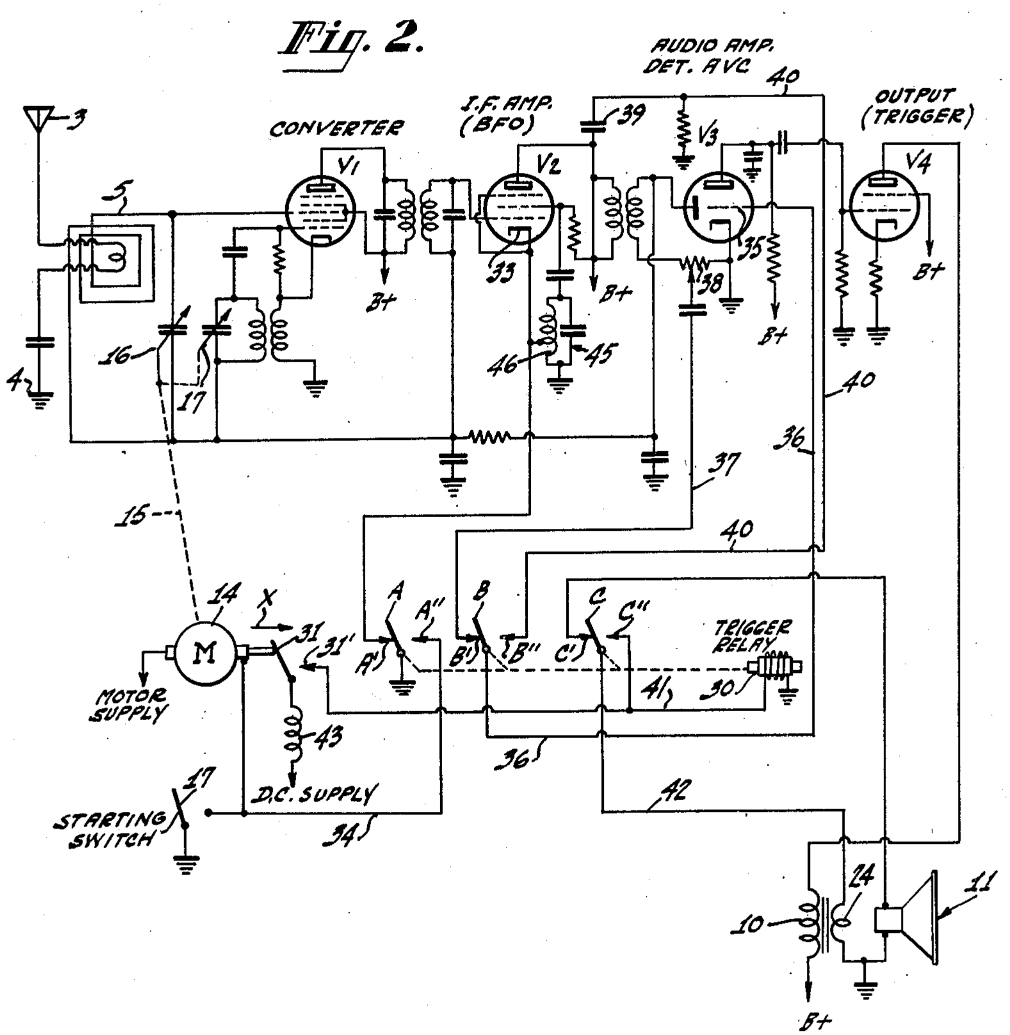
Figure 2 is a modification of the invention shown in Fig. 1.

In Fig. 2, the antenna and ground, 3 and 4, respectively, are shown connectively coupled to the loop circuit 5, as in Fig. 1. The converter tube V1, the I. F. amplifier tube V2, the multi-purpose audio amplifier tube V3, and the output tube V4 normally function for signal reception substantially the same as heretofore described in reference to Fig. 1. The tuning motor 14 is connected by the shaft 15 to the tuner represented by condensers 16 and 17, and operates in the same manner as described in relation to Fig. 1. The loudspeaker or transducer 11, with the primary and secondary windings, 10 and 24 respectively of its transformer and the starting switch 17, also function the same as similar parts described in reference to Fig. 1. The switching is somewhat different however, as will be explained below.

With further reference to Fig. 2, momentary actuation of starting switch 17 causes energization of the tuning motor 14, due to the longitudinal movement of the insulated motor shaft in the direction of the arrow X, which shaft movement causes the contact set 31—31' to close. A trigger relay 30 has one end of its windings grounded, as shown by the conventional symbol, and the other end connected through lead 41 to contact 31'. A source of energy indicated by the legend "D. C. supply" is connected through a choke coil 43 to the movable contact 31. Closure of contact set 31—31' energizes the trigger relay 30, which in turn, will cause the movable contacts A, B, and C to be moved to the right so that there is an opening of contact sets A—A', B—B', and C—C', and a closure of contact sets A—A'', B—B'', and C—C''. An oscillation-controlling tank circuit 45 is grounded through the closed contact set A—A', thereby shunting out the feedback section 46 of the coil in the tank circuit 45 and preventing oscillation of tube V2. The opening of the contact set A—A' ungrounds the feedback coil section 46, thereby causing tube V2 to function as the BFO. Closure of contact set A—A'' completes the energizing circuit of motor 14 by way of conductor 34 and grounded contact A, contact set 31—31' establishing a holding circuit for the relay. The motor will remain running to operate the tuner as long as the relay is energized and the contact set A—A'' is closed. When the contact set B—B' is closed, the grid 35 of the audio amplifier tube V3 is connected via conductors 36 and 37, to the volume control 38. Shifting of contact B to contact B'' connects the grid 35, via conductors 36 and 40 to the coupling condenser 39, thereby coupling the output of the BFO to the audio amplifier tube V3.

The voice coil of the loudspeaker 11 is in series with the contact set C—C' so that the voice coil circuit is closed when the radio receiver is in receiving condition. Opening of the contact set C—C' mutes the loudspeaker. Closure of contact set C—C'' places the windings of trigger relay 30, via conductors 41 and 42, across the secondary of the output transformer. The trigger relay 30 is de-energized by current supplied through the secondary winding 24 as will hereinafter be explained.

The operation of the radio receiver, while in the signal seeking condition, will be maintained until a suitable signal is tuned in and is similar to that heretofore described in reference to Fig. 1. As the zero beat is approached during the signal seeking operation, a negative swing of sufficiently high intensity and low frequency supplied by lead 42 from winding 24, cancels at least part of the relay energizing direct current supplied through contact 31' and causes the trigger relay 30 to be deenergized for a period of time sufficiently long to permit the contacts A, B, and C to return to the normal playing position as shown in Fig. 2. The restoration of contact set A—A' to closed position deenergizes the motor 14 and connects the cathode 33 of the I. F. amplifier tube V2 to ground. Restoration of contact set B—B' to closed position again connects the grid 35 of the audio amplifier tube V3 to the gain control 38. The restoration of contact set C—C' to closed position removes the trigger relay 30 from the output circuit, and closes the voice coil circuit of the loudspeaker 11. When the motor 14 stops turning, contacts 31, 31' separate, and the radio receiver is placed in playing position.

In Fig. 1, the audio amplifier tube V3 is utilized as the beat frequency oscillator, while in Fig. 2 the I. F. amplifier is utilized as the beat frequency oscillator.

While specific circuits have been shown to illustrate the invention, it is to be understood that changes and modifications may be made therein without departing from the spirit of the invention as defined by the appended claims.

I claim as my invention:

1. A radio receiver for receiving signals within the radio frequency spectrum comprising at least one electron tube and tuning means connected in operative relation for selecting and converting received radio signals to corresponding intermediate frequency signals, means including additional electronic tubes for amplifying said intermediate frequency signals, means coupled to the output of said electronic tubes tuned to a predetermined fixed intermediate frequency, an audio frequency amplifier tube and a signal output circuit for said receiver coupled with said last named means, said tuning means including a tuning device having a movable element for scanning said spectrum to select a desired radio signal, a motor for driving said tuning device, means including a switch for energizing said motor, a reactive element selectively connected in circuit with one of said tubes and said motor to establish beat frequency oscillations therein of a fixed frequency substantially equal to said predetermined intermediate frequency only upon operation of said motor, means for beating said beat frequency oscillations with said intermediate frequency signals to produce resultant low beat frequency signals, relay means selectively connected in circuit with said output circuit and said motor only upon operation of said motor, and means responsive to certain of said low beat frequency signals developed only when the frequency of said intermediate frequency signals substantially corresponds to the frequency of said beat frequency oscillations for operating said relay means to deenergize said motor.

2. A receiver as defined in claim 1 wherein said reactive element is selectively connected in circuit with an intermediate frequency amplifier tube.

3. A receiver as defined in claim 1 wherein said reactive element is selectively connected in circuit with said audio frequency amplifier tube.

4. A radio receiver of the superheterodyne type for receiving radio signals in a predetermined frequency range including at least a frequency converter tube for converting the received radio signals to intermediate frequency signals, an intermediate frequency amplifier tube, and an audio amplifier tube, tuning means having a movable tuning element for pre-selecting the desired signal frequency to be impressed upon said converter tube, and an output circuit connected to said audio amplifier tube; a motor for driving said tuning element, control means for controlling the energization of said motor, an inductive element selectively connected in circuit with said audio amplifier tube and said motor to provide a circuit providing beat frequency oscillations at substantially the same frequency as the receiver intermediate frequency in response to operation of said motor, means for beating said oscillations with said intermediate frequency signals to produce low frequency beat signals, relay means selectively connected in circuit with said output circuit and said motor in response to energization of said motor, means responsive to certain of said low beat frequency signals developed only when the frequency of said intermediate frequency signals substantially corresponds to the frequency of said beat frequency oscillations for operating said relay means, and switching means for controlling the deenergization of said motor to cause cessation of the tuning motor operation responsive to deenergization of said relay means.

5. A radio receiver of the superheterodyne type for receiving radio signals in a predetermined frequency range including at least a frequency converter tube, an intermediate frequency amplifier tube, and an audio amplifier tube, tuning means having a movable tuning element for preselecting the desired signal frequency to be impressed upon said converter tube, and an output circuit connected to said audio amplifier tube; a motor for driving said tuning element, control means for controlling the energization of said motor, an inductive element selectively connected in circuit with said intermediate frequency amplifier tube and said motor to provide a circuit for providing beat frequency oscillations at substantially the same frequency as the receiver intermediate frequency in response to operation of said motor, means for beating said oscillations with said intermediate frequency signals to produce low frequency beat signals, relay means selectively connected in circuit with said output circuit and said motor in response to energization of said motor, means responsive to certain of said low beat frequency signals developed only when the frequency of said intermediate frequency signals substantially corresponds to the frequency of said beat frequency oscillations for operating said relay means, and switching means for controlling the deenergization of said motor to cause cessation of the tuning motor operation responsive to deenergization of said relay means.

OLIVER E. COLGAN.

References Cited in the file of this patent

UNITED STATES PATENTS

| Number | Name | Date |
|---|---|---|
| 2,035,176 | McLennan | Mar. 24, 1936 |
| 2,177,713 | Granqvist | Oct. 31, 1939 |
| 2,224,224 | Hallam | Dec. 10, 1940 |
| 2,262,218 | Andrews | Nov. 11, 1941 |
| 2,304,871 | Andrews | Dec. 15, 1942 |
| 2,369,542 | Dietrich | Feb. 13, 1945 |
| 2,387,544 | Usselman | Oct. 23, 1945 |
| 2,409,012 | Bliss | Oct. 8, 1946 |